(12) United States Patent
Natori et al.

(10) Patent No.: US 11,139,173 B2
(45) Date of Patent: Oct. 5, 2021

(54) PRODUCTION METHOD OF SEMICONDUCTOR DEVICE

(71) Applicant: TOSHIBA MEMORY CORPORATION, Tokyo (JP)

(72) Inventors: Katsuaki Natori, Yokkaichi Mie (JP); Satoshi Wakatsuki, Yokkaichi Mie (JP); Masayuki Kitamura, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 62 days.

(21) Appl. No.: 16/031,544

(22) Filed: Jul. 10, 2018

(65) Prior Publication Data
US 2019/0259621 A1 Aug. 22, 2019

(30) Foreign Application Priority Data
Feb. 16, 2018 (JP) .............................. JP2018-026364

(51) Int. Cl.
*H01L 21/285* (2006.01)
*H01L 21/768* (2006.01)

(52) U.S. Cl.
CPC .. *H01L 21/28556* (2013.01); *H01L 21/76843* (2013.01); *H01L 21/76877* (2013.01)

(58) Field of Classification Search
CPC ......... H01L 21/28556; H01L 21/76843; H01L 21/76877
USPC .......................................... 427/248.1–255.7
See application file for complete search history.

(56) References Cited

U.S. PATENT DOCUMENTS

| 4,844,719 | A | | 7/1989 | Toyomoto et al. |
| 5,240,505 | A | * | 8/1993 | Iwasaki ............... C23C 16/0272 118/715 |
| 5,926,737 | A | * | 7/1999 | Ameen ................... C23C 16/14 257/E21.165 |
| 6,010,940 | A | * | 1/2000 | Lee ......................... C23C 16/34 438/396 |
| 6,025,243 | A | * | 2/2000 | Ohmi ................ H01L 21/28562 148/DIG. 107 |
| 6,270,572 | B1 | * | 8/2001 | Kim ........................ C23C 16/44 117/93 |
| 9,053,927 | B2 | | 6/2015 | Hirose et al. |
| 2006/0009034 | A1 | * | 1/2006 | Lai .......................... H01L 21/44 438/680 |

(Continued)

FOREIGN PATENT DOCUMENTS

| JP | 2016-98406 A | 5/2016 |
| JP | 6324609 B1 | 5/2018 |
| WO | WO 2016/098183 A1 | 6/2016 |

*Primary Examiner* — Michael P Wieczorek
*Assistant Examiner* — Michael G Miller
(74) *Attorney, Agent, or Firm* — Foley & Lardner LLP

(57) ABSTRACT

A production method of a semiconductor device includes introducing a reduction gas for reducing metal to a space containing a target to be used as the semiconductor device. The method also includes introducing a material gas and a first gas simultaneously to the space on a basis of a predetermined partial pressure ratio after introducing the reduction gas, to form a film that contains the metal, on the target. The material gas etches the metal when only the material gas is flowed. The first gas is different from the material gas. The predetermined partial pressure ratio is a ratio of the material gas and the first gas.

15 Claims, 16 Drawing Sheets

(56) References Cited

U.S. PATENT DOCUMENTS

| | | | |
|---|---|---|---|
| 2006/0258173 A1* | 11/2006 | Xiao | C23C 16/36 438/780 |
| 2008/0099147 A1* | 5/2008 | Myo | C23C 16/45574 156/345.34 |
| 2008/0119098 A1* | 5/2008 | Palley | C23C 16/403 442/64 |
| 2011/0303965 A1* | 12/2011 | Kim | H01L 27/11526 257/321 |
| 2017/0287716 A1* | 10/2017 | Kaga | H01L 21/285 |
| 2018/0142345 A1 | 5/2018 | Meng et al. | |

* cited by examiner

PRODUCTION METHOD OF SEMICONDUCTOR DEVICE

CROSS-REFERENCE TO RELATED APPLICATIONS

This application is based upon and claims the benefit of priority from Japanese Patent Application No. 2018-026364, filed Feb. 16, 2018, the entire contents of which are incorporated herein by reference.

FIELD

Embodiments described herein relate generally to a production method of a semiconductor device.

BACKGROUND

A typical production process of a semiconductor device may include a process of forming a metal film that functions as a plug or a wiring. The metal film is, for example, formed by a film deposition process using a material gas that contains metal and a reduction gas that reduces the material gas.

DETAILED DESCRIPTION

In the film deposition process of the metal film, for example, the metal film can be etched depending on the pressure condition of the material gas. In another example, one or more kinds of elements of a compound contained in the reduction gas can be left in the metal film depending on the composition of the compound. These phenomena may cause decrease the coverage of the metal film.

Some embodiments provide a production method of a semiconductor device having a film formed with a superior coverage.

In general, according to some embodiments, a production method of a semiconductor device includes introducing a reduction gas for reducing metal to a space containing a target to be used as the semiconductor device. The method also includes introducing a material gas and a first gas simultaneously to the space on a basis of a predetermined partial pressure ratio after introducing the reduction gas, to form a film that contains the metal, on the target. The material gas etches the metal when only the material gas is flowed to the space. The first gas is different from the material gas. The predetermined partial pressure ratio is a ratio of the material gas and the first gas.

Hereinafter, embodiments of the present disclosure will be described with reference to the drawings. The embodiments are not intended to limit the present disclosure.

First Embodiment

Figure 1:
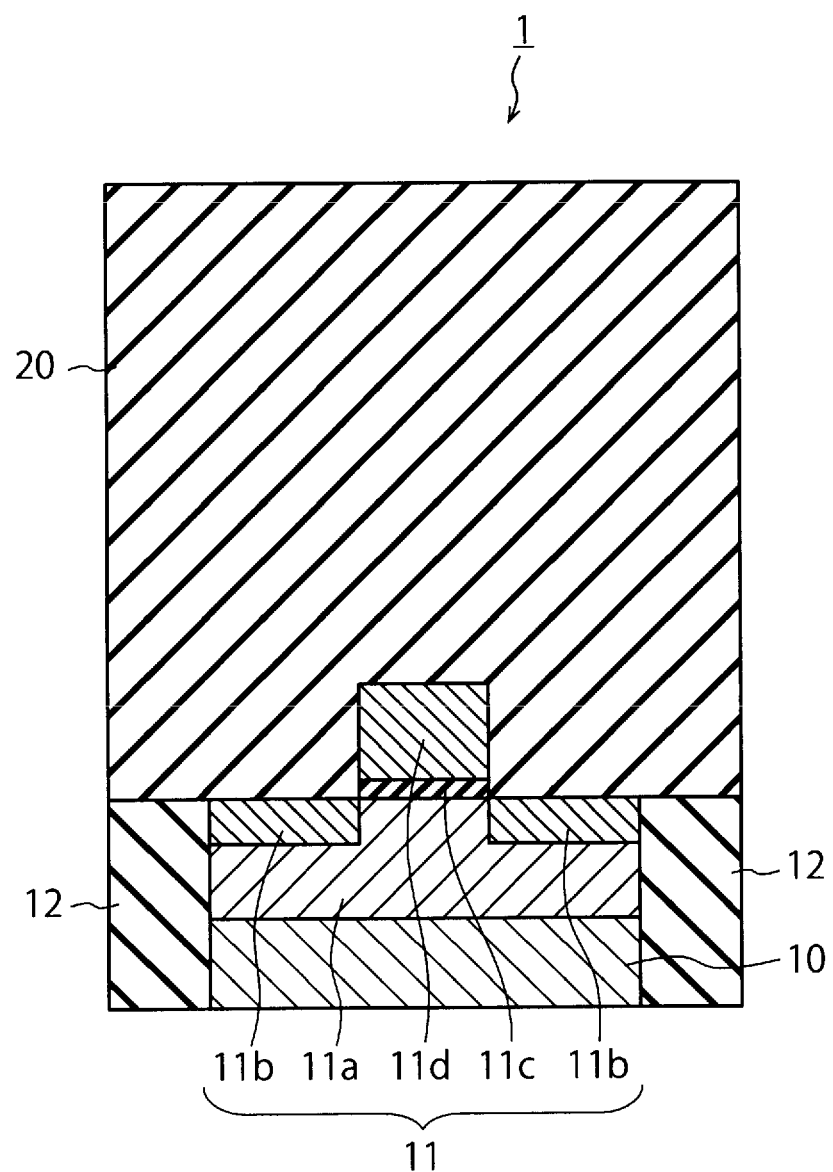
FIG. 1 is a sectional view illustrating a formation process of a transistor and an element isolating film.
Figure 2:
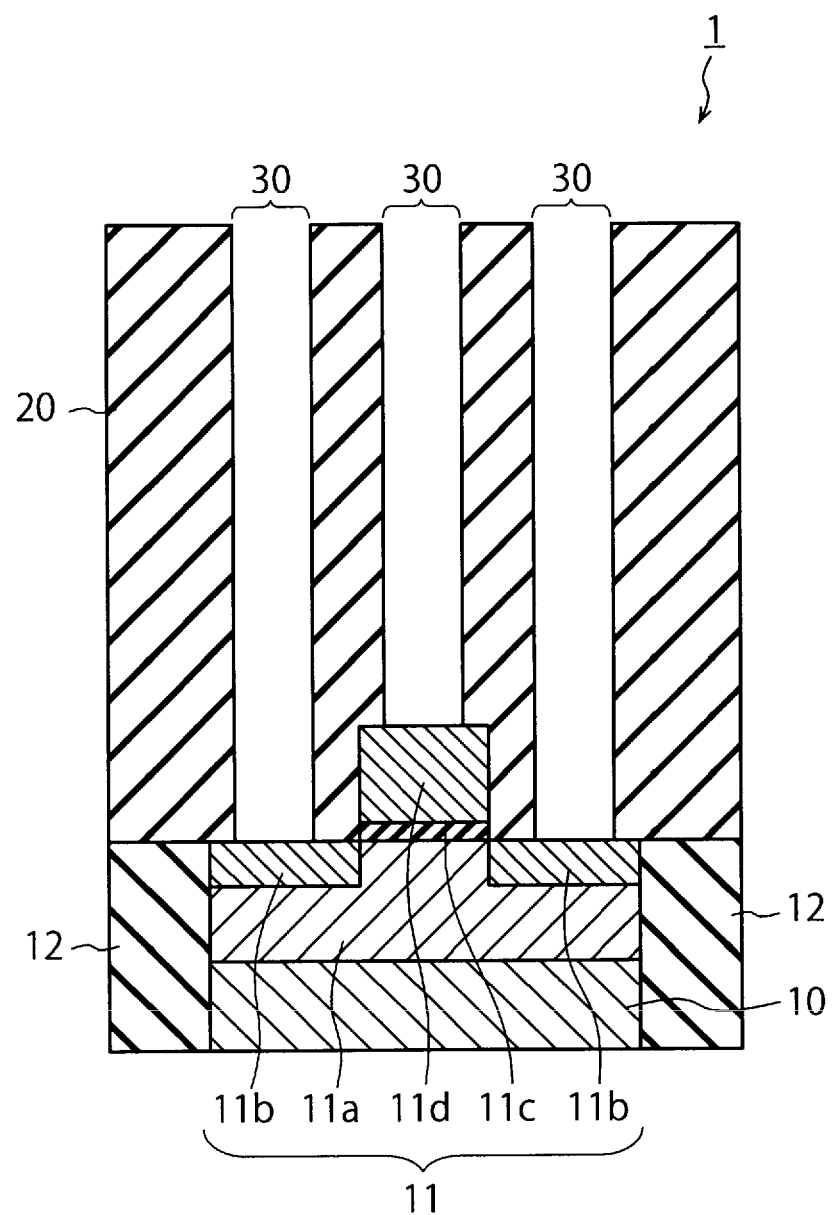
FIG. 2 is a sectional view illustrating a formation process of via holes.
Figure 3:
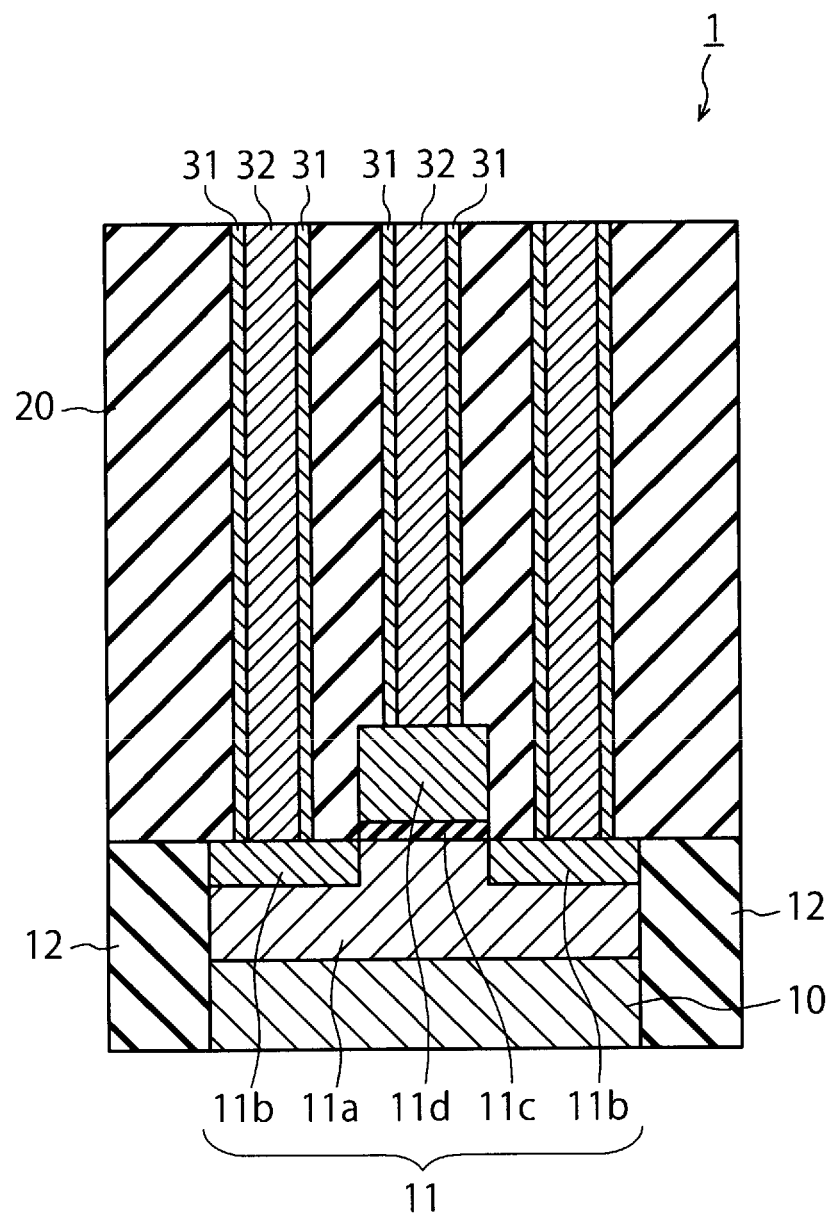
FIG. 3 is a sectional view illustrating a formation process of a barrier metal film and a metal film.

FIGS. 1 to 3 are sectional views illustrating a production process of a semiconductor device according to some embodiments. The semiconductor device 1 according to this embodiment can be used for, for example, a three-dimensionally stacked semiconductor storage device in which a word line (WL) is stacked. FIGS. 1 to 3 illustrate a part of a peripheral circuit to be connected to a memory cell of the semiconductor storage device. The production method described in some embodiments can be used for not only forming such a peripheral circuit but also for forming the word line. In the following, a production process of the semiconductor device 1 according to some embodiments will be described.

As illustrated in FIG. 1, first, a transistor 11 and an element isolating film 12 are formed on a semiconductor substrate 10. The semiconductor substrate 10 may be, for example, a silicon substrate.

The transistor 11 includes a semiconductor layer 11a, a diffusion layer 11b, a gate insulating film 11c, and a gate electrode 11d. The transistor 11 functions as, for example, a select transistor that selects the memory cell of a three dimensional memory. The element isolating film 12 is formed by using an insulating material such as $SiO_2$, to isolate the transistor 11 from other elements.

The transistor 11 and the element isolating film have an interlayer insulating film 20 thereon. The interlayer insulating film 20 is formed by using $SiO_2$, for example. The interlayer insulating film 20 may be made of a multilayer film.

Next, as illustrated in FIG. 2, via holes 30 are formed in the interlayer insulating film 20 by etching using a mask pattern. The via holes 30 pass through the interlayer insulating film 20 to reach the diffusion layer 11b and the gate electrode lid.

Then, as illustrated in FIG. 3, a barrier metal film 31 and a metal film 32 are successively formed within the via hole 30. The barrier metal film 31 is, for example, formed by a chemical vapor deposition (CVD) method. The barrier metal film 31 is, for example, made of TiN.

Figure 4:
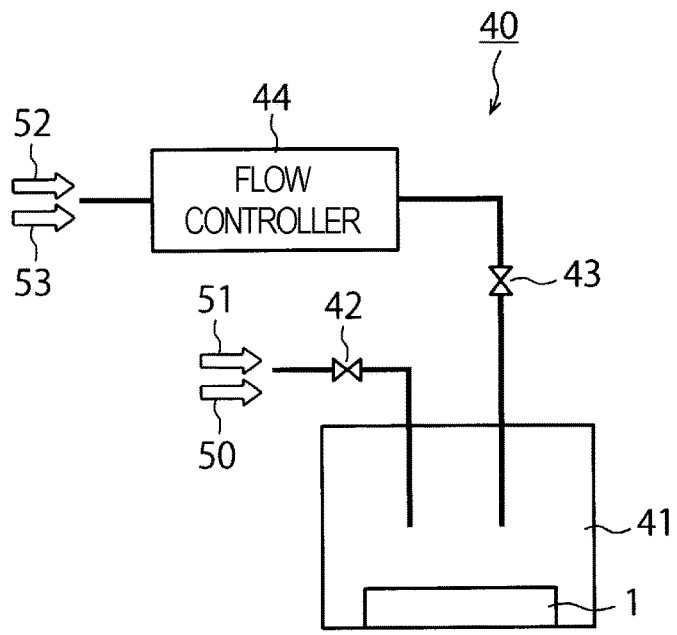
FIG. 4 illustrates a schematic configuration of a film deposition device that deposits a metal film.

The metal film 32 is, for example, deposited by using a film deposition device 40. The film deposition device 40, which is illustrated in FIG. 4, uses an atomic layer deposition (ALD) method. The film deposition device 40 includes a chamber 41, valves 42 and 43, and a flow controller 44.

The chamber 41 can contain the semiconductor device 1. In forming the metal film 32, for example, the temperature in the chamber 41 is approximately 500° C., and the pressure in the chamber 41 is approximately 1333 Pa (10 Torr).

The valve 42 is placed in a flow channel of an inert gas 50 that functions as a carrier gas and a reduction gas 51. That is, the inert gas 50 and the reduction gas 51 are supplied from the respective containers to the chamber 41 through the flow channel. Although the inert gas 50 and the reduction gas 51 use the same flow channel in some embodiments, they may use different flow channels. The valve 43 is provided in a flow channel of a material gas 52 and an etching-suppressing gas (first gas) 53. That is, the material gas 52 and the etching-suppressing gas 53 are supplied from the respective containers to the chamber 41 through the flow channel. Although the material gas 52 and the etching-suppressing gas 53 use the same flow channel in this embodiment, they may use different flow channels. The flow controller 44 controls a flow rate of the material gas 52, for example. In a case in which two or more of the inert gas 50, the reduction gas 51, the material gas 52, and the etching-suppressing gas 53 are made of the same material, the gases made of the same material may use the same flow channel and may use the same container.

The inert gas 50 may be, for example, argon. The reduction gas 51 is, for example, hydrogen. In a case in which the material of the metal film 32 is molybdenum, the material gas 52 can be a $MoCl_5$ gas, for example. In this embodiment, the material gas 52 is an etching gas by which the film deposition rate will be minus and by which the etching is accelerated when only the material gas 52 is flowed in the chamber 41. That is, when only the material gas 52 is flowed, the material gas 52 etches the material of the metal film 32, for example, etches molybdenum. The etching-suppressing gas 53 is, for example, hydrogen.

Figure 5:
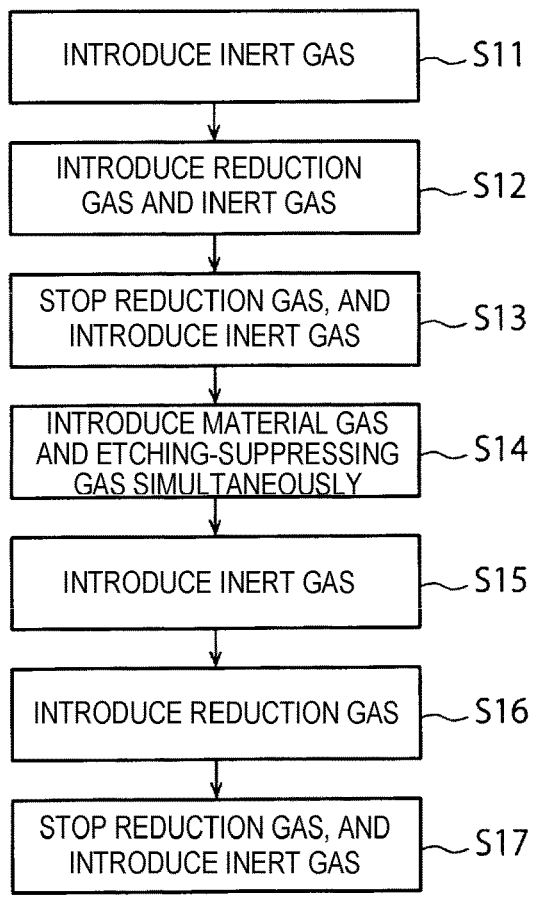
FIG. 5 illustrates a film deposition process of a metal film.

In some embodiments, the metal film 32 was deposited within the via hole 30 by the film deposition equipment 40 in accordance with the flowchart as illustrated in FIG. 5. The following describes a film deposition process of the metal film 32.

First, the valve 42 is opened to introduce the inert gas 50 to the chamber 41 (step S11). In this step, the inert gas 50 purges the chamber 41.

Next, in the condition in which the inert gas 50 is introduced, the reduction gas 51 is also introduced to the chamber 41 (step S12). Thus, the inert gas 50 and the reduction gas 51 are introduced to the chamber 41. In this step, hydrogen contained in the reduction gas 51 is adsorbed to the surface of the semiconductor device 1. This prevents the surface of the barrier metal film 31 from being oxidized.

Then, whereas the introduction of the reduction gas 51 is stopped, the introduction of the inert gas 50 is continued (step S13). That is, only the inert gas 50 is introduced. As a result, hydrogen remained in the chamber 41 is purged. In this step, the efficiency of the purge can be increased by reducing the pressure in the chamber 41. Alternatively, the efficiency of the purge may be increased by introducing a great amount of the inert gas 50 to the chamber 41 to temporarily increase the pressure in the chamber 41.

Thereafter, the valve 43 is opened to introduce the material gas 52 in the chamber 41, and the material gas is made to be adsorbed to base films of the barrier metal film 31 and other layers (step S14). The etching-suppressing gas 53 is also introduced to the chamber 41 at the same time as the material gas 52. In this step, the flow controller 44 controls the flow rate of the material gas 52, thereby controlling the material gas 52 and the etching-suppressing gas 53 at the most appropriate partial pressure ratio.

For example, the flow controller 44 may be a mass flow controller and controls the partial pressure of the material gas 52 on the basis of a predetermined partial pressure ratio so that the partial pressure ratio of the material gas and the etching-suppressing gas 53 will be the most appropriate. In another example, the flow controller 44 may be a temperature control system that is provided to the container of the material gas 52 and controls the temperature of the material gas 52 on the basis of a predetermined temperature so that the partial pressure ratio of the material gas 52 and the etching-suppressing gas 53 will be the most appropriate. Although the flow rate of the material gas 52 is controlled in some embodiments, the target to be controlled by the flow controller 44 is not limited to the material gas 52 and may be the flow rate of the etching-suppressing gas 53.

Although details of the most appropriate partial pressure ratio will be described later, the partial pressure ratio is set so that the material gas 52 does not accelerate etching of the metal film 32 and so that the film deposition amount will be 0 to 0.05 nm in step S14.

Figure 6:
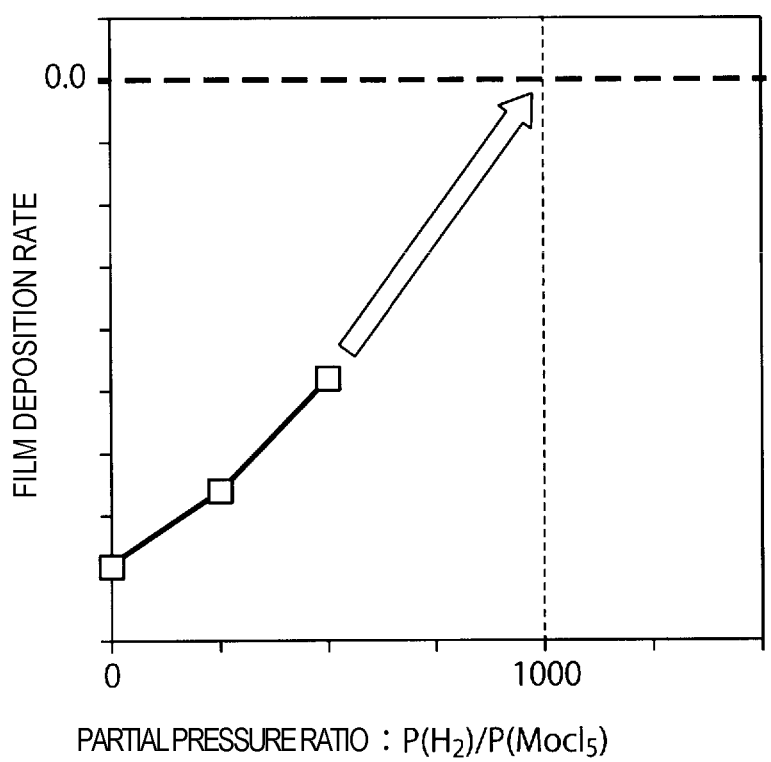
FIG. 6 is a graph illustrating a relationship between a partial pressure ratio and a film deposition rate.

FIG. 6 is a graph illustrating a relationship between the partial pressure ratio and a film deposition rate. The horizontal axis in FIG. 6 represents a ratio of a partial pressure of the etching-suppressing gas 53 (P ($H_2$)) and a partial pressure of the material gas 52 (p($MoCl_5$)). The vertical axis represents the film deposition rate of the metal film 32.

As illustrated in FIG. 6, in the condition in which the partial pressure of the material gas 52 is high, that is, the partial pressure of the etching-suppressing gas 53 is low, the film deposition rate is negative even when the material gas 52 and the etching-suppressing gas 53 are introduced at the same time. This means that the material gas 52 can etch the metal film 32. Thus, the metal film 32 is difficult to deposit.

In view of this, in some embodiments, the partial pressure of the etching-suppressing gas 53 is set higher than the partial pressure of the material gas 52 to suppress the etching of the metal film 32. For example, in a case in which the material gas 52 is a $MoCl_5$ gas, and the etching-suppressing gas 53 is a hydrogen gas, the partial pressure of the etching-suppressing gas 53 is desirably 1000 times higher than the partial pressure of the material gas 52. Naturally, the pressure ratio varies depending on the process temperature and the pressure. In some embodiments, to make the film deposition rate positive, for example, the partial pressure of the material gas 52 is controlled. More preferably, the partial pressure is controlled so that the film deposition amount will be 0 to 0.05 nm. For example, in a case in which the film deposition amount is 0.05 nm or greater, the thickness of the film formed by the CVD method, that is, the film deposition amount in step S14, is great, which may cause decrease in the coverage.

After the material gas 52 and the etching-suppressing gas 53 are introduced to the chamber 41 at the same time under the partial pressure condition as described above, the introduction of the material gas 52 and the etching-suppressing gas 53 is stopped, and, instead, the inert gas 50 is introduced to the chamber 41 (step S15). As a result, substances floating in the chamber 41 are purged.

Next, the reduction gas 51 is introduced to the chamber 41 (step S16). The introduced reduction gas 51 reduces the adsorbed material gas 52, whereby a metal film 32 is made.

Thereafter, the introduction of the reduction gas 51 is stopped, and, instead, the inert gas 50 is introduced to the chamber 41 to perform purging (step S17). Then, the operation from steps S12 to S17 is repeated until the metal film 32 has a predetermined thickness.

According to this embodiment, the etching-suppressing gas 53 that is introduced at the same time as the material gas 52 functions as a gas for suppressing the etching of the metal film 32 by the material gas 52. Thus, the metal film 32 is formed with a superior coverage. The material of the metal film 32 is not limited to molybdenum and may be silicon, for example. For example, in a case of using a $SiCl_4$ gas as the material gas 52, the material gas 52 can etch silicon when the partial pressure of the $SiCl_4$ gas is high. In view of this, in a similar manner as in this embodiment, an etching-suppressing gas 53, for example, a hydrogen gas, of which the partial pressure is set higher than the partial pressure of the material gas 52, is introduced to the chamber 41 at the same time as the material gas 52 to suppress the etching. As a result, a silicon film is formed with a superior coverage.

Second Embodiment

Figure 7A:
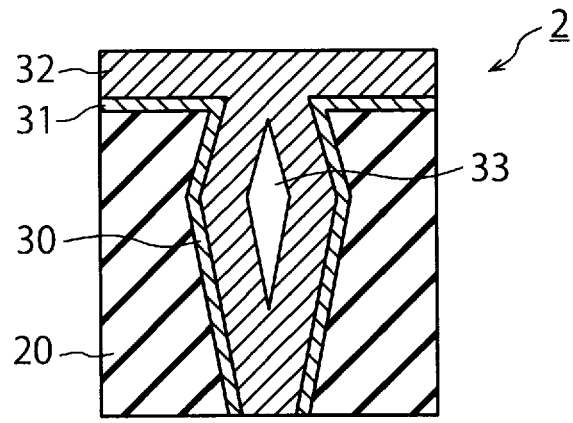
FIGS. 7A to 7C are sectional views illustrating a production process of a semiconductor device according to a second embodiment.
Figure 7B:
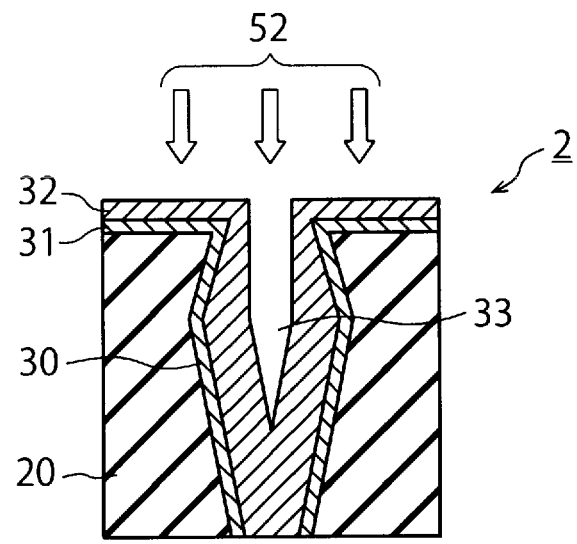
Figure 7C:
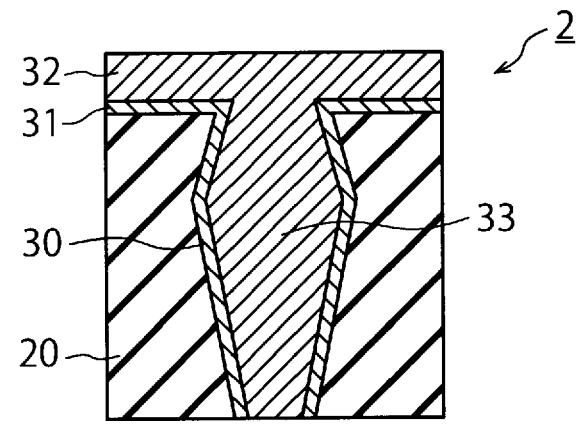

FIGS. 7A to 7C are sectional views illustrating a production process of a semiconductor device according to some embodiments. The components similar to those in the first embodiment are represented by the same reference signs, and detailed descriptions of these components are not repeated.

As illustrated in FIG. 7A, a part of the via hole 30 may be outwardly curved in some cases. In such cases, forming a metal film 32 by repeating the operation in steps S12 to S17 described in the first embodiment may generate a cavity (seam) 33 within the via hole 30.

To cope with this problem, in a semiconductor device 2 according to some embodiments, as illustrated in FIG. 7B, the metal film 32 covering the opening of the via hole 30 is partially etched by the material gas 52. At this time, the inert gas 50 is introduced to the chamber 41, whereas the etching-suppressing gas 53 is not introduced to the chamber 41.

The partial etching of the metal film 32 exposes the cavity 33 from the via hole 30. Successively, the operation in steps S12 to S17, which is described in the first embodiment, is repeated to thicken the metal film 32. As a result, as illustrated in FIG. 7C, the cavity 33 is filled and buried with the metal film 32.

According to this embodiment, the metal etching function of the material gas 52 is used to enable filling and burying the cavity 33 with the metal film 32. Thus, a film is formed with a superior coverage regardless of the shape of the film forming area.

Third Embodiment

FIGS. 8 to 14 are sectional views illustrating a production process of a semiconductor device according to this embodiment. The production method described in this embodiment can be used to form the word line (WL) of the three dimensionally stacked semiconductor storage device described above, for example. This production method can also be used to form the peripheral circuit, which is described in the first embodiment. The following describes a production process of a semiconductor device 3.

Figure 8:
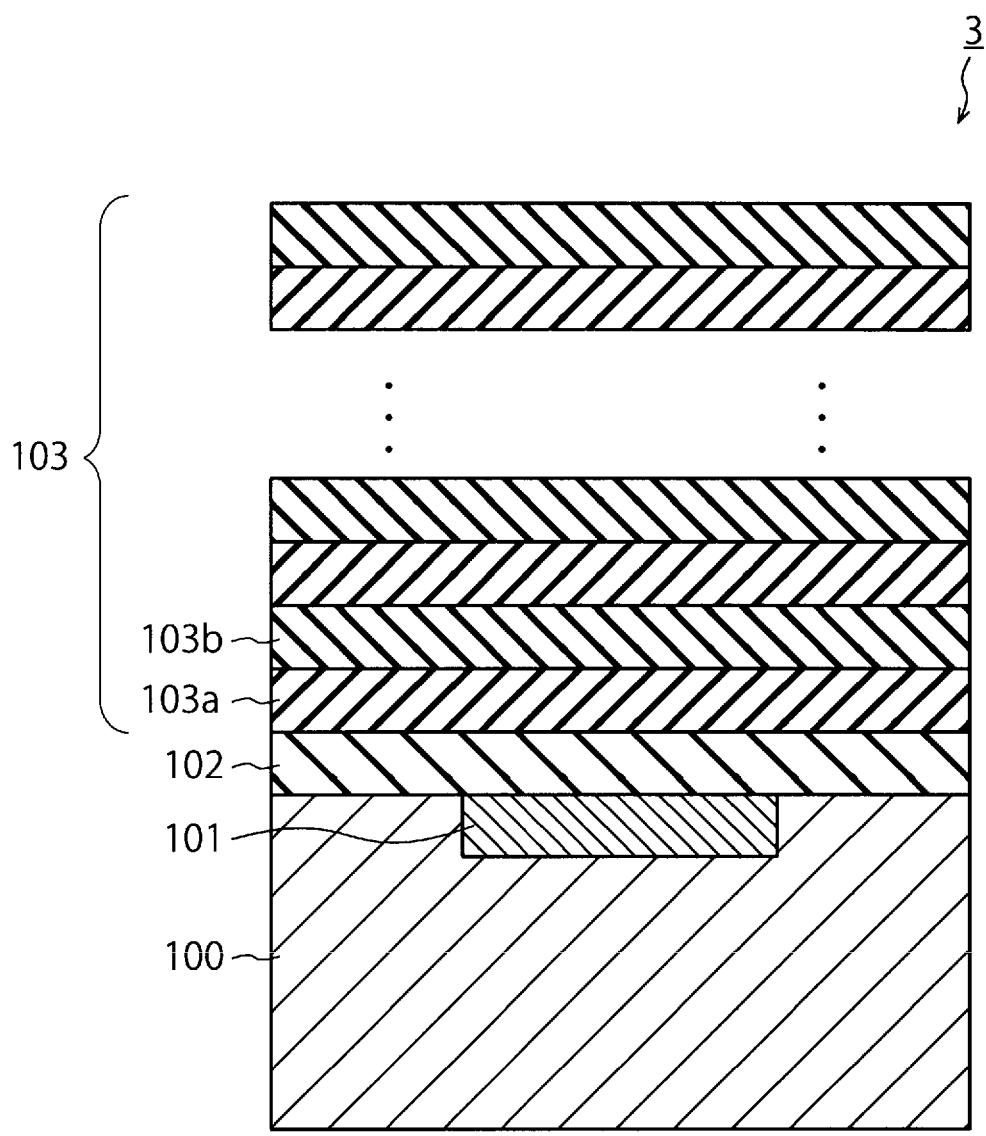
FIG. 8 is a sectional view illustrating a formation process of a stacked body.

First, as illustrated in FIG. 8, a stacked body 103 is formed on a semiconductor substrate 100. The semiconductor substrate 100 has a diffusion layer 101 formed on its surface. The diffusion layer 101 is connected to a select transistor. The semiconductor substrate 100 and the stacked body 103 have an interlayer insulating film 102 formed therebetween.

The stacked body 103 has insulating layers 103a and 103b that are alternately stacked. The insulating layer 103a is, for example, formed as a SiN layer. The insulating layer 103b is formed as a $SiO_2$ layer. The insulating layers 103a and 103b are stacked by the CVD method, for example.

Figure 9:
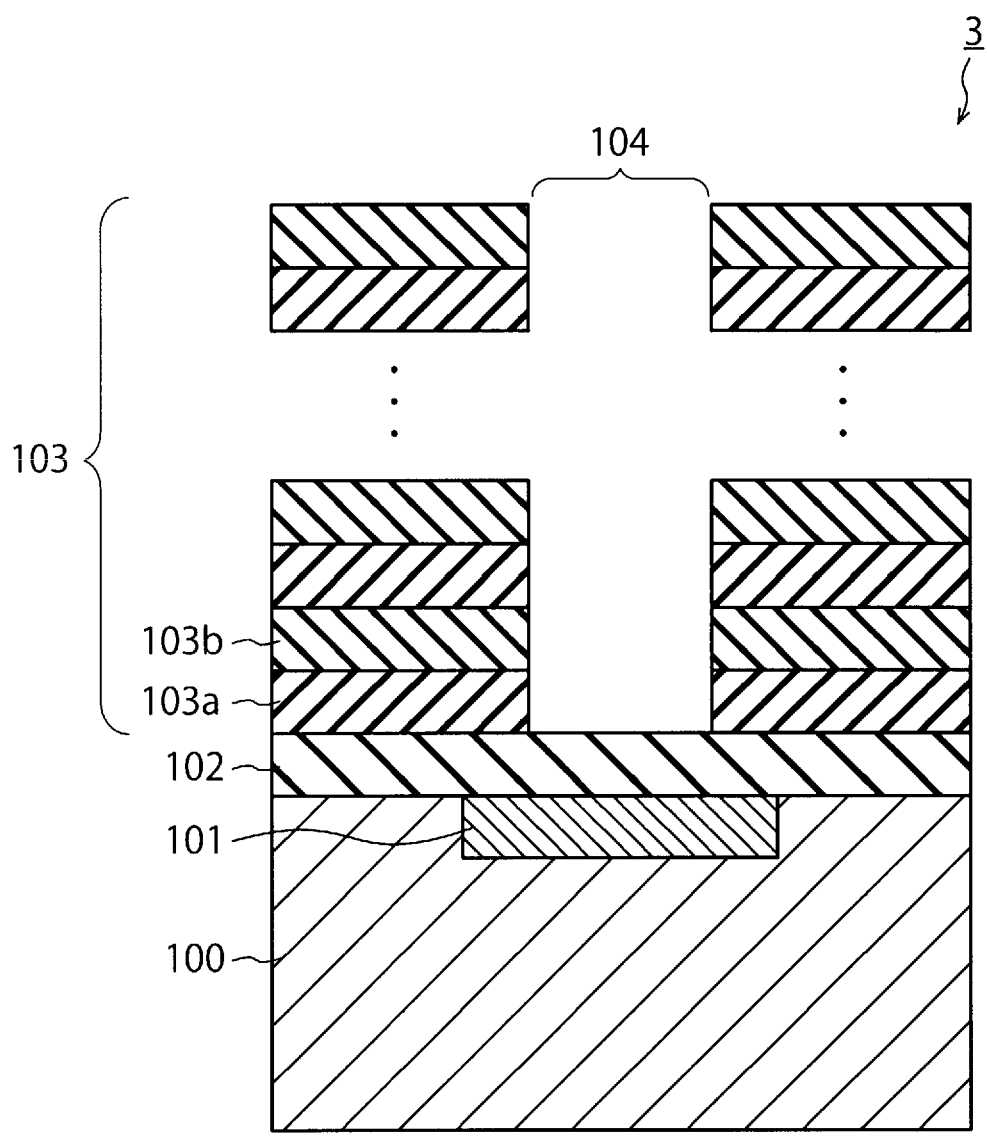
FIG. 9 is a sectional view illustrating a formation process of a memory hole.
Figure 10:
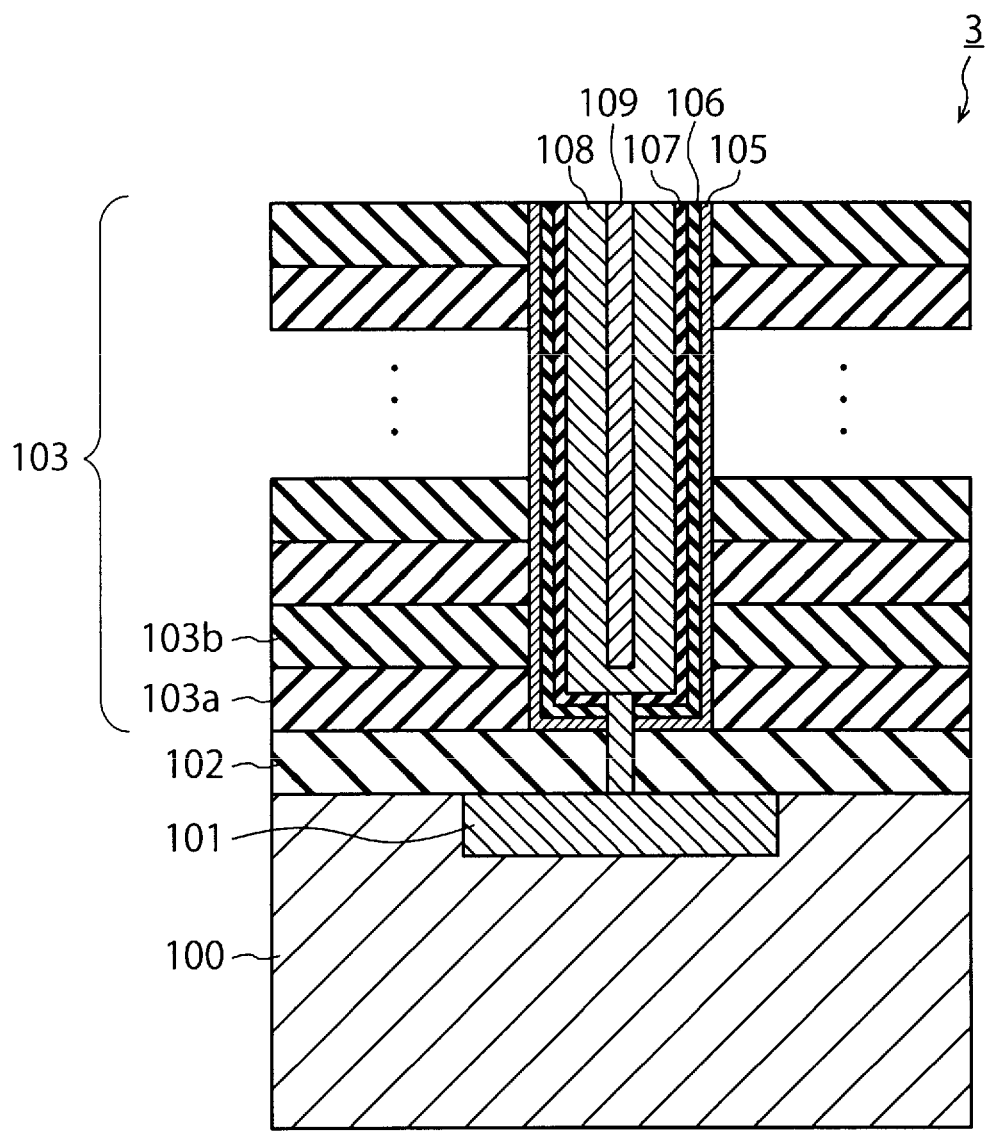
FIG. 10 is a sectional view illustrating a formation process of a memory cell.

Next, as illustrated in FIG. 9, a memory hole 104 is formed by using a lithography method, for example. A memory cell is formed in the memory hole 104. In a formation process of the memory cell, as illustrated in FIG. 10, a block layer 105, a charge storage layer 106, a tunnel insulating layer 107, a channel layer 108, and a core layer 108 are successively formed.

In this embodiment, the block layer 105 is formed as an $Al_2O_3$ layer by using a trimethyl aluminum (TMA) gas and an ozone ($O_3$) gas. The charge storage layer 106 is formed as a SiN layer by using a tridimethylaminosilane (3DMAS) gas and the ozone gas. The tunnel insulating layer 107 is formed as a $SiO_2$ layer. The channel layer 108 is formed as a polysilicon layer. The channel layer 108 is electrically connected to the diffusion layer 101. The core layer 109 is formed as a $SiO_2$ layer.

Figure 11:
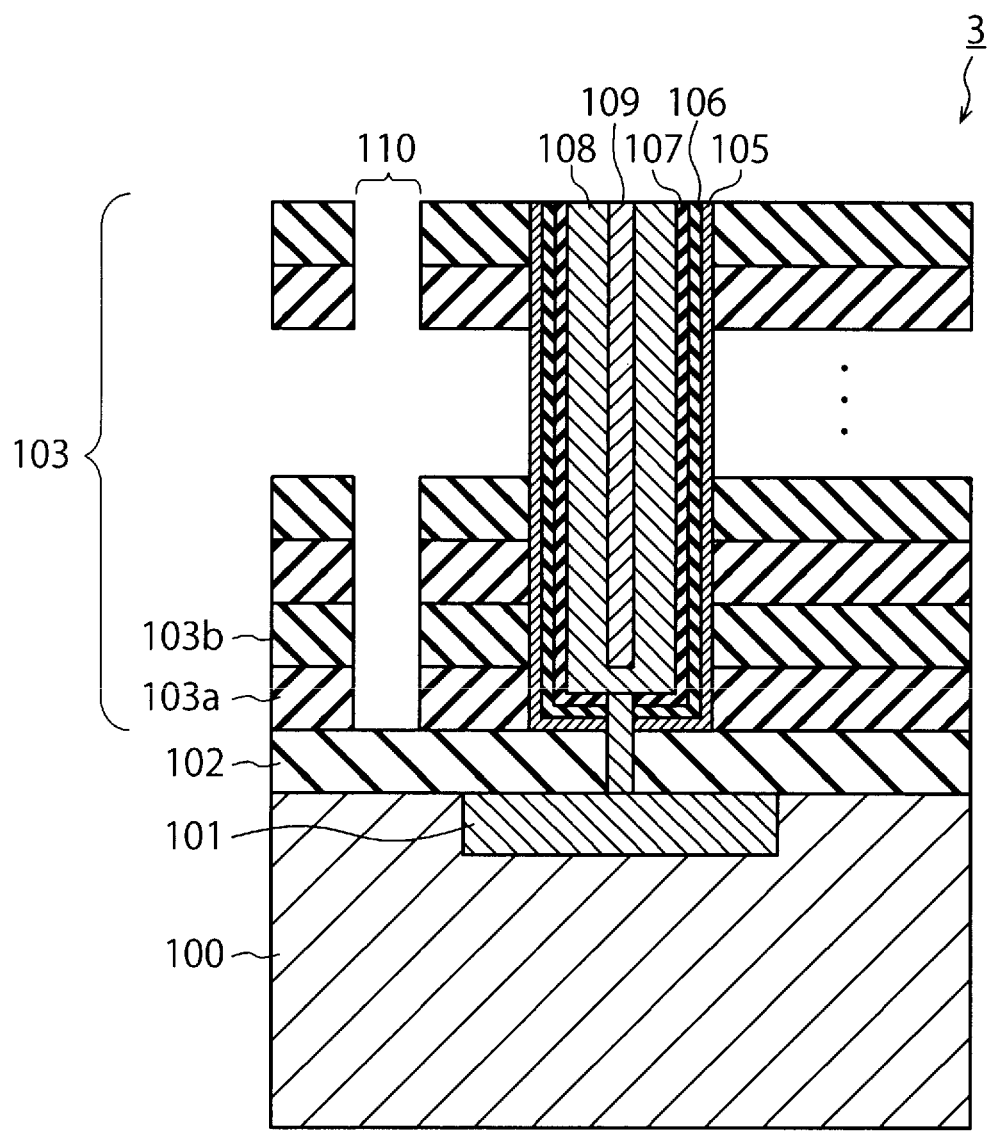
FIG. 11 is a sectional view illustrating a formation process of a slit.

Next, as illustrated in FIG. 11, a slit 110 is formed by using lithography and reactive ion etching (RIE). The slit 110 passes through the stacked body 103 in the vicinity of the memory cell.

Figure 12:
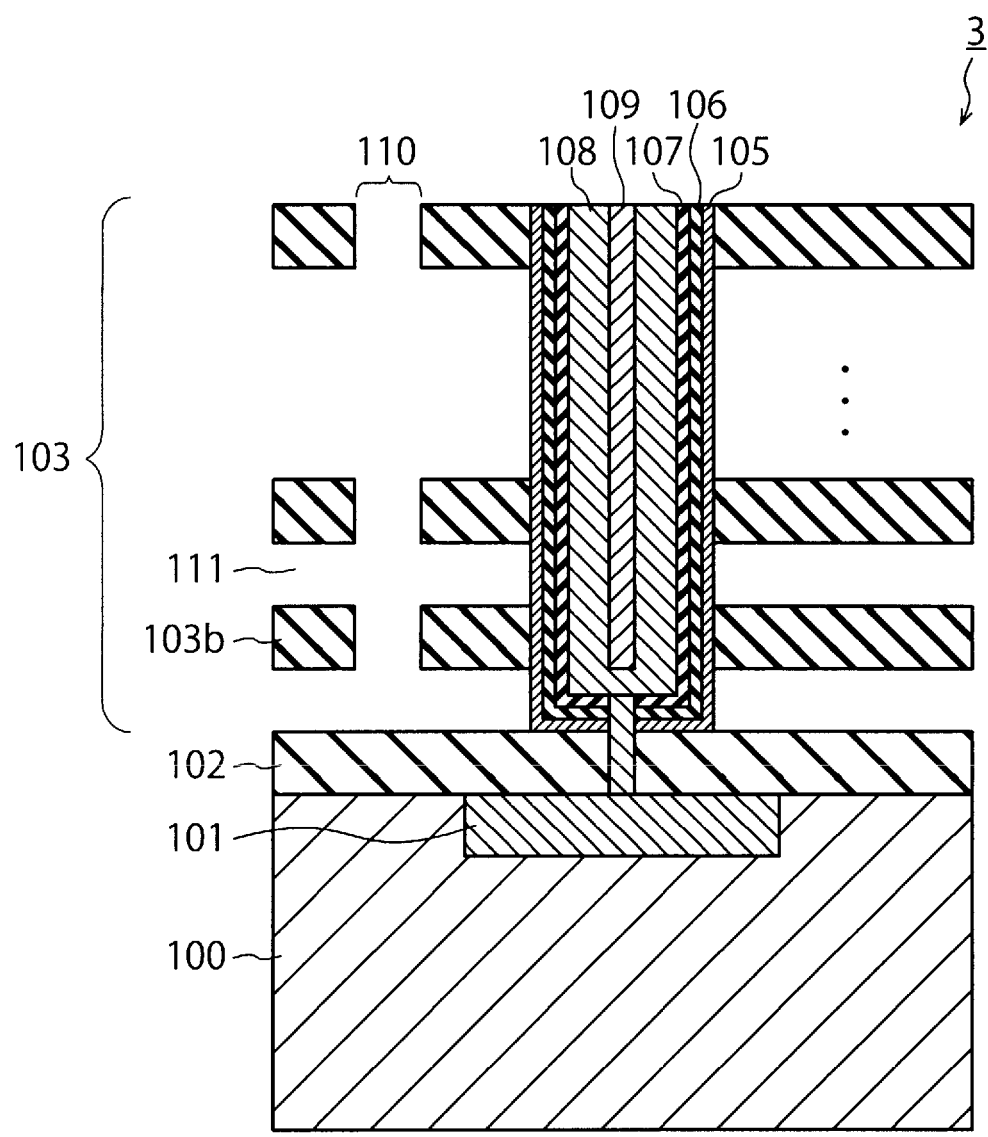
FIG. 12 is a sectional view illustrating a formation process of a hole.

Then, the insulating layer 103a is etched by, for example, immersing the semiconductor device 3 in phosphoric acid solution at high temperature. As a result, as illustrated in FIG. 12, a hole 111 is formed in the stacked body 103.

Figure 13:
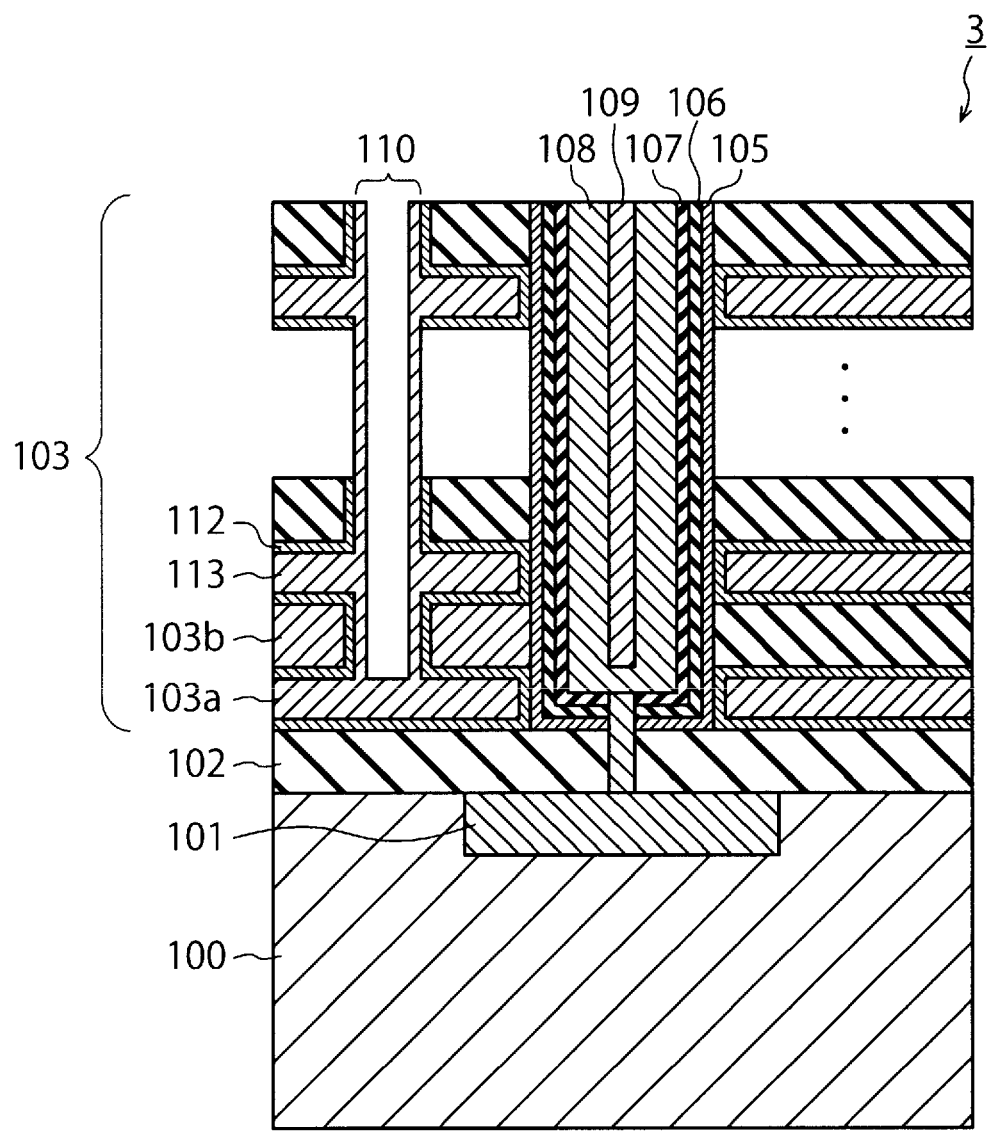
FIG. 13 is a sectional view illustrating a formation process of a barrier metal film and a metal film.
Figure 14:
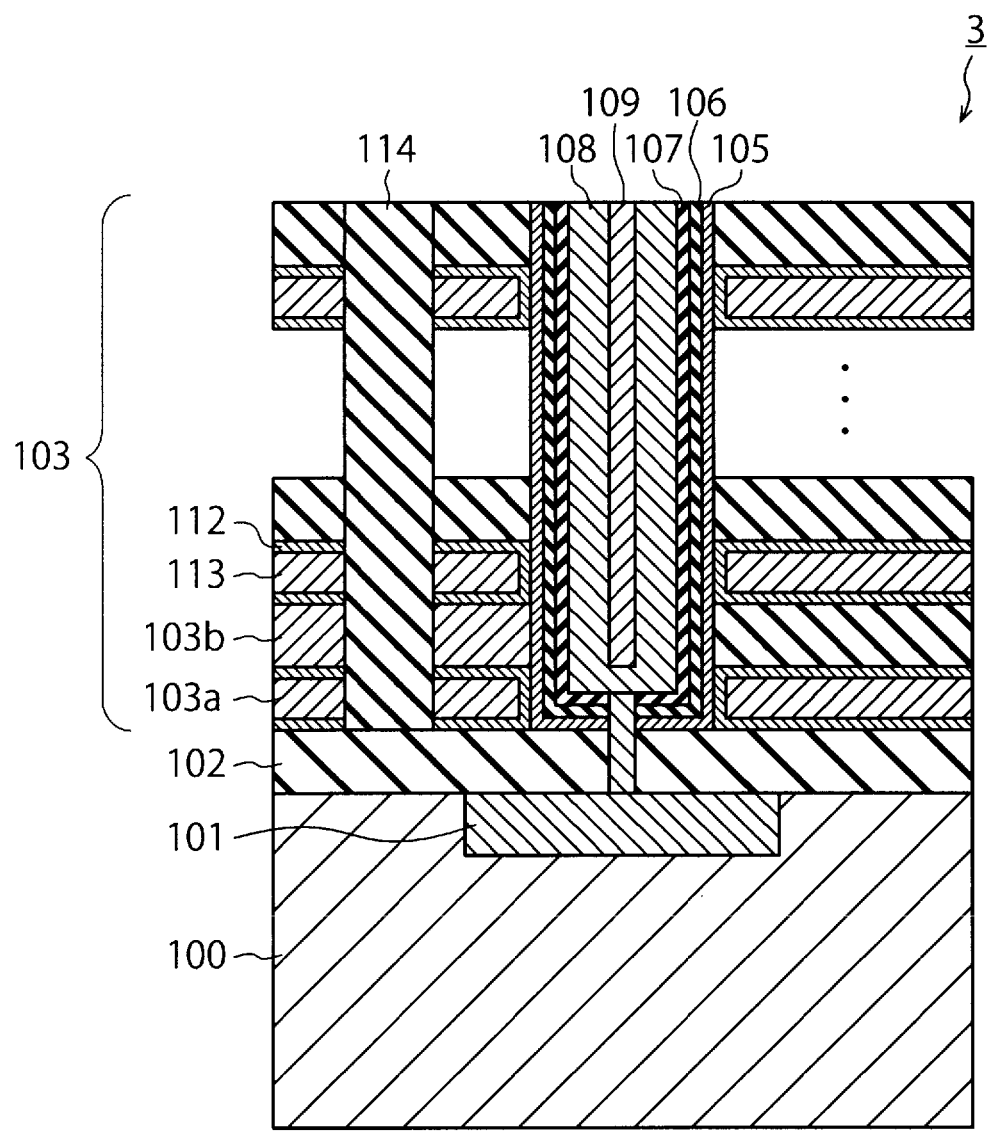
FIG. 14 is a sectional view illustrating a process of embedding an insulating film in the slit.

Thereafter, as illustrated in FIG. 13, a barrier metal film 112 and a metal film 113 are successively formed within the hole 111. At this time, a part of the barrier metal film 112 and a part of the metal film 113 are left within the slit 110. Since the left parts of the films are unnecessary, they are etched. Finally, as illustrated FIG. 14, an insulating film 114 such as one made of $SiO_2$ is embedded in the slit 110.

In the process illustrated in FIG. 13, the barrier metal film 112 is a film for preventing diffusion of the metal contained in the metal film 113. In this embodiment, the barrier metal film 112 is formed as a TiN layer by using a $TiCl_4$ gas and a $NH_3$ gas.

The metal film 113 functions as a word line that drives the memory cell. The metal film 113 is formed by using a film deposition device, which uses the atomic layer deposition (ALD) method and is similar to the film deposition equipment 40 described in the first embodiment. The following describes a film deposition process of the metal film 113.

Figure 15A:
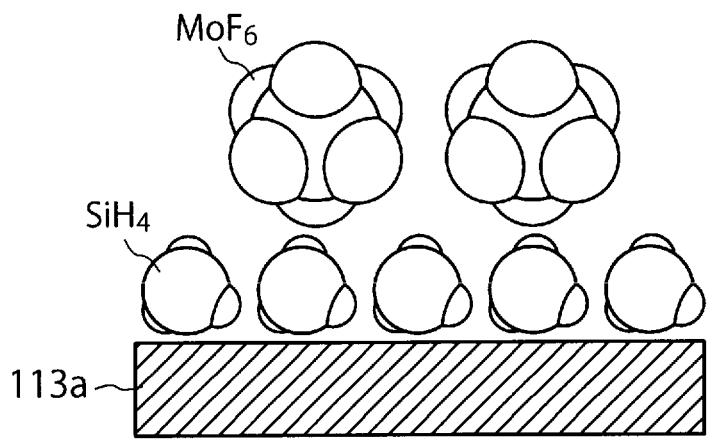
FIGS. 15A and 15B are models representing a deposited condition of a metal film using a combination of $MoF_6$ and $SiH_4$.
Figure 15B:
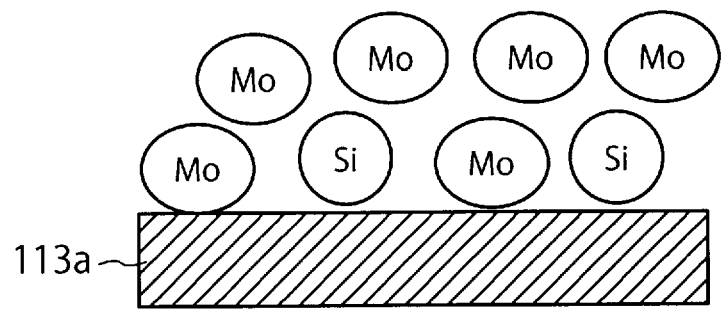

FIGS. 15A and 15B are models representing a deposited condition of a metal film using a combination of $MoF_6$ and $SiH_4$. In these models, a deposition film of molybdenum (Mo) is formed as a metal film 113a by alternately introducing a material gas of $MoF_6$ gas and a reduction gas of $SiH_4$ gas.

As illustrated in FIG. 15A, the volume of a $MoF_6$ molecule is greater than the volume of a $SiH_4$ molecule. The volume of a silicon (Si) atom is smaller than the volume of a molybdenum atom. Thus, as illustrated in FIG. 15B, the silicon atom may be covered with the molybdenum atoms before all of the $SiH_4$ molecules react with the $MoF_6$ molecules. This causes the silicon atoms to remain in the metal film 113a, which may increase the resistivity of the metal film 113a of molybdenum.

In view of this, one of the hydrogen atoms of the $SiH_4$ molecule is replaced with a halogen, an amino group, or an alkyl group, to increase its molecule volume. This enables decrease in the amount of silicon adsorbed in the surface of the metal film.

In this embodiment, a $SiH_3(CH_3)$ gas is used as the reduction gas to form the metal film 113. Specifically, the flow rates of the $MoF_6$ gas and the $SiH_3$ $(CH_3)$ gas are respectively set at $1.69\times10^{-2}$ Pa·m³/sec (100 sccm). Each of the gases is introduced for 0.1 seconds 300 times. A hydrogen gas is introduced for 1 second between the introduction of the $MoF_6$ gas and the introduction of the $SiH_3(CH_3)$ gas to purge the reaction space. The pressure of the reaction space is maintained at approximately 133.3 Pa (1 Torr). Under these film deposition conditions, a metal film 113 having a thickness of approximately 30 nm is formed.

Figure 16A:
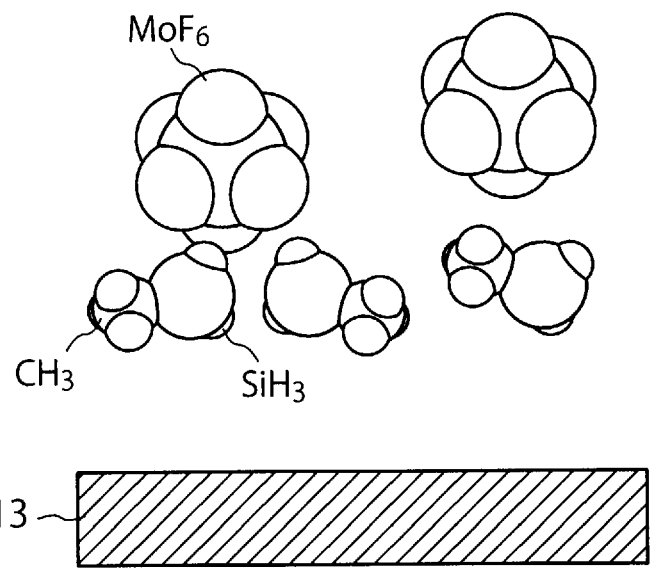
FIGS. 16A and 16B are models representing a deposited condition of a metal film using a combination of $MoF_6$ and $SiH_3(CH_3)$.
Figure 16B:
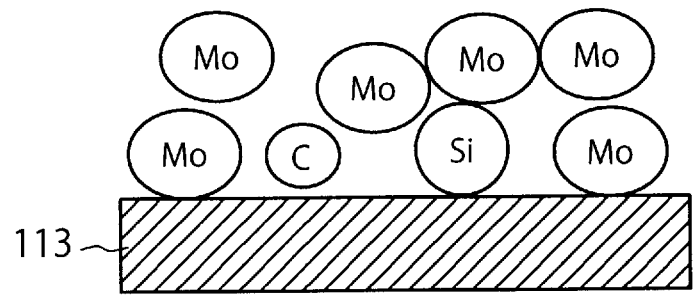

FIGS. 16A and 16B are models representing a deposited condition of a metal film using a combination of $MoF_6$ and $SiH_3$ $(CH_3)$. The volume of the $SiH_3$ $(CH_3)$ molecule illustrated in FIG. 16A is greater than the volume of the $SiH_4$ molecule illustrated in FIG. 15A. Thus, the amount of silicon adsorbed in the surface of the metal film 113 is decreased. As a result, as illustrated in FIG. 16B, the amount of silicon remaining is decreased. This prevents an increase in the resistivity.

The compound contained in the reduction gas is not limited to $SiH_3$ $(CH_3)$. For example, the compound may be any of $SiH_3Cl$, $SiH_3N$ $(CH_3)_2$, $SiH_3N$ $(CH_3)(C_2H_5)$, $SiH_3N$ $(C_2H_5)_2$, $SiH_3N(C_3H_7)_2$, $SiH_3N$ $(C_4H_9)_2$, or $SiH_3(C_2H_5)$.

Figure 17:
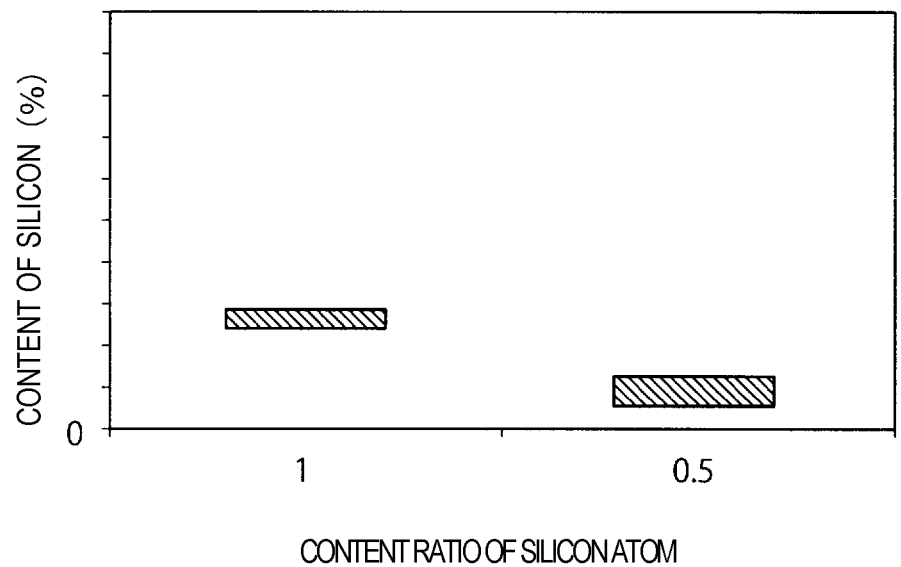
FIG. 17 is a graph illustrating a relationship between a content ratio of silicon atoms in a reduction gas and the content of silicon in a molybdenum film.

FIG. 17 is a graph illustrating a relationship between a content ratio of the silicon atoms relative to the amount of the elements in the compound of a reduction gas, and a content of the silicon in a molybdenum film. Herein, the hydrogen is not counted in the amount of the elements in the compound of a reduction gas. For example, in a case of a $SiH_4$ compound, the element other than hydrogen is considered to be only silicon. In this case, the content ratio of the silicon atom is "1". In a case of a $SiH_3(CH_3)$ compound, the element other than hydrogen is silicon and carbon (C). In this case, the content ratio of the silicon atom is "0.5".

As illustrated in FIG. 17, when the content ratio of the silicon atoms in the compound is low, the content of the silicon in the molybdenum film is small. For this reason, using the reduction gas that contains a compound of which the volume is greater than the volume of the $SiH_4$ molecule enables suppressing increase in the resistivity of the metal film 113.

Figure 18:
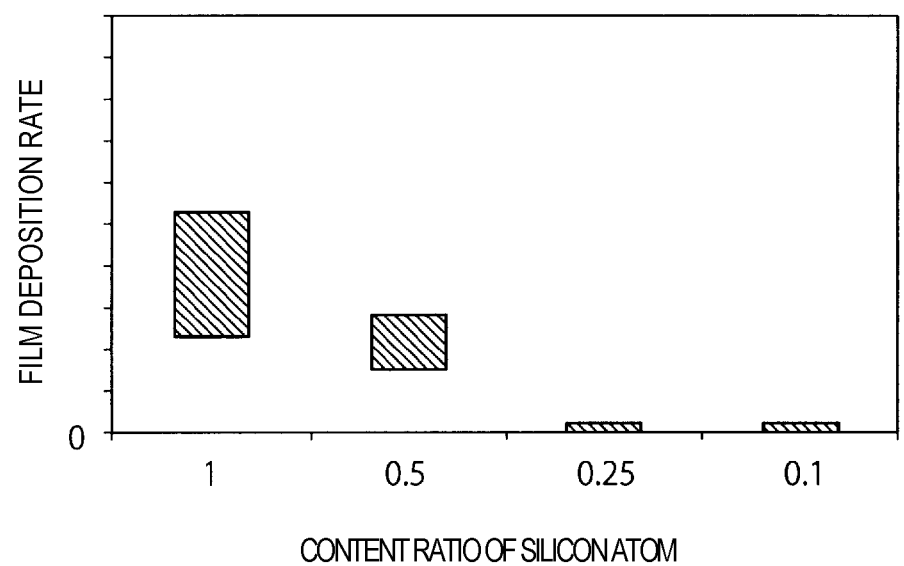
FIG. 18 is a graph illustrating a relationship between a content ratio of silicon atom in a reduction gas and a film deposition rate of a molybdenum film.

FIG. 18 is a graph illustrating a relationship between a content ratio of the silicon atoms relative to the amount of the elements in the compound of a reduction gas, and a film deposition rate of a molybdenum film. Herein, in a similar manner as in FIG. 17, the hydrogen is not counted in the amount of the elements in the compound of a reduction gas.

As illustrated in FIG. 18, the film deposition rate of the molybdenum film decreases as the content ratio of the silicon atoms in the compound decreases. Thus, to obtain a sufficient film deposition rate while suppressing the containing amount of silicon, the content ratio of the silicon atoms in the compound of the reduction gas is more desirably approximately "0.5".

According to some embodiments, the reduction gas is composed of a compound of a silicon atom, three hydrogen atoms, and a molecule having a volume greater than the volume of the hydrogen atom. This suppresses the adsorption of the silicon to the metal film 113, thereby enabling formation of a metal film 113 with low resistivity.

The material of the metal film 113 is not limited to molybdenum and may be tungsten, for example. In this case, for example, a tungsten film containing a small amount of silicon is formed by alternately introducing a material gas of $WF_6$ gas and a reduction gas of $SiH_3Cl$ gas.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of producing a semiconductor device comprising:
   preparing a target having an opening;
   forming a molybdenum film in the opening, wherein the step of forming a molybdenum film comprises:
      introducing a reduction gas that reduces a material gas to a space containing the target to be used as the semiconductor device; and
      after introducing the reduction gas, introducing the material gas and a first gas simultaneously to the space based on a predetermined partial pressure ratio, wherein the material gas includes molybdenum element and chlorine element,
   wherein the material gas etches the film when only the material gas is flowed to the space, the first gas being different from the material gas, and the predetermined partial pressure ratio being a ratio of the material gas and the first gas to form the film; and
   after forming the film, introducing the material gas without introducing the first gas to partially etch the film.

2. The method of claim 1, wherein after the material gas and the first gas are simultaneously introduced to the space, the space is purged with an inert gas, and thereafter, the reduction gas is introduced again to the space.

3. The method of claim 2, wherein two or more of the inert gas, the reduction gas, the material gas, and the first gas are of a same material.

4. The method of claim 1, wherein the first gas is a hydrogen gas.

5. The method of claim 4, wherein the partial pressure of the hydrogen gas is 1000 times higher than the partial pressure of the material gas.

6. The method of claim 1, wherein the partial pressure of the first gas is set higher than the partial pressure of the material gas.

7. The method of claim 1, wherein the first gas is used as a gas for suppressing etching by the material gas.

8. The method of claim 1, wherein the semiconductor device is one of a semiconductor storage device or a peripheral device.

9. The method of claim 1, further comprising forming a barrier metal film, and forming the film on the barrier metal film.

10. The method of claim 1, wherein the film is formed using an atomic layer deposition method.

11. The method of claim 1, wherein the partial pressure ratio is set so that the material gas does not accelerate etching of the film.

12. The method of claim 1, wherein the material gas includes $MoCl_5$.

13. The method of claim 1, prior to etching the film, further comprising performing the step of forming a film multiple times.

14. The method of claim 1, wherein the opening is curved outwardly with an increasing depth.

15. The method of claim 1, wherein the target further comprises:
- a stacked body on a substrate;
- a semiconductor layer extending in a first direction crossing the substrate; and
- a charge storage layer extending in the first direction and provided between the semiconductor layer and the stacked body.

* * * * *